United States Patent [19]
Ito

[11] Patent Number: 5,197,035
[45] Date of Patent: Mar. 23, 1993

[54] SEMICONDUCTOR MEMORY
[75] Inventor: Akira Ito, Kunitachi, Japan
[73] Assignee: Hitachi, Ltd., Tokyo, Japan
[21] Appl. No.: 259,731
[22] Filed: Oct. 19, 1988
[30] Foreign Application Priority Data
  Nov. 6, 1987 [JP] Japan ................. 62-280750
[51] Int. Cl.⁵ ............................. G11C 7/00
[52] U.S. Cl. ............... 365/230.05; 365/189.04; 365/189.07
[58] Field of Search ........ 365/230.01, 230.05, 365/230.06, 189.07, 189.04

[56] References Cited
U.S. PATENT DOCUMENTS
4,599,708  7/1986 Schuster ............... 365/189.04
4,623,990 11/1986 Allen et al. ........... 365/189.04

OTHER PUBLICATIONS
P. S. Bennett et al., "High Performance BIMOS Gate Arrays With Embedded Configurable Static Memory", IEEE 1987 Custom Integrated Circuits Conference, pp. 195–198.

Primary Examiner—Joseph A. Popek
Attorney, Agent, or Firm—Antonelli, Terry, Stout & Kraus

[57] ABSTRACT

In a multiport memory, a data selector is provided by which, when addresses designated by at least two ports agree and one port and the other port are respectively set in a write mode and a read mode, write data to be supplied from one port is directly transmitted as read data for the other port without first being transmitted through the memory array.

37 Claims, 6 Drawing Sheets

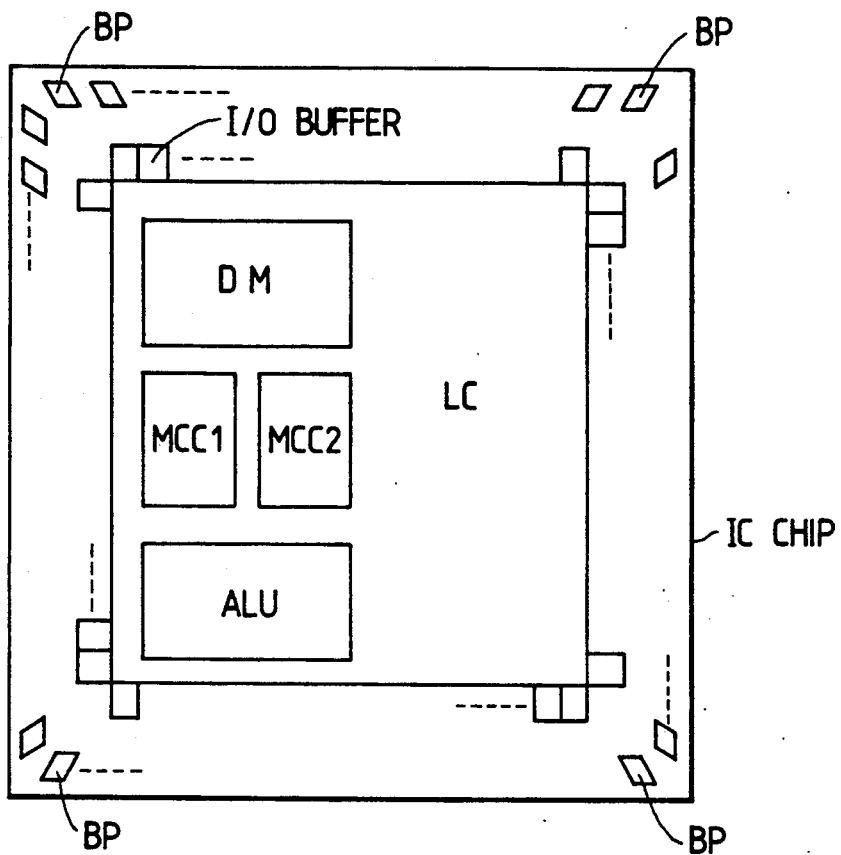
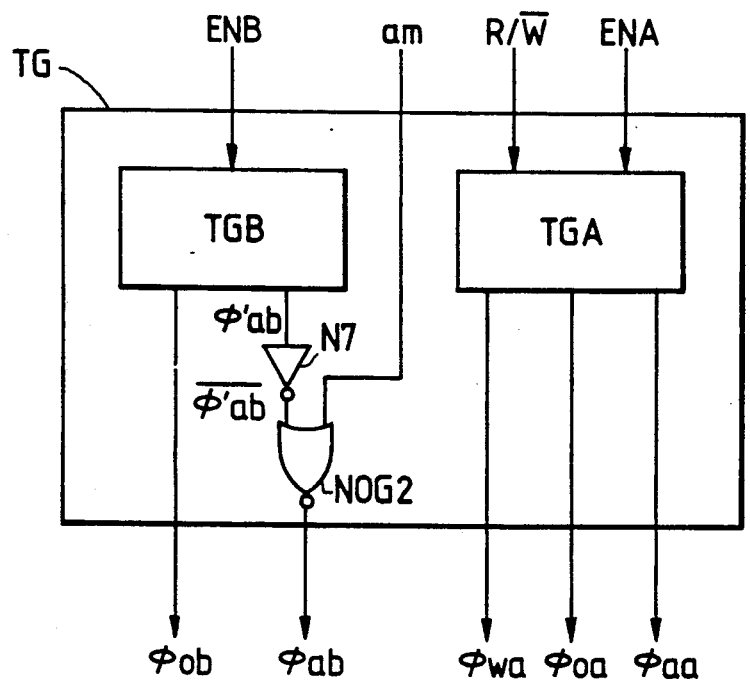

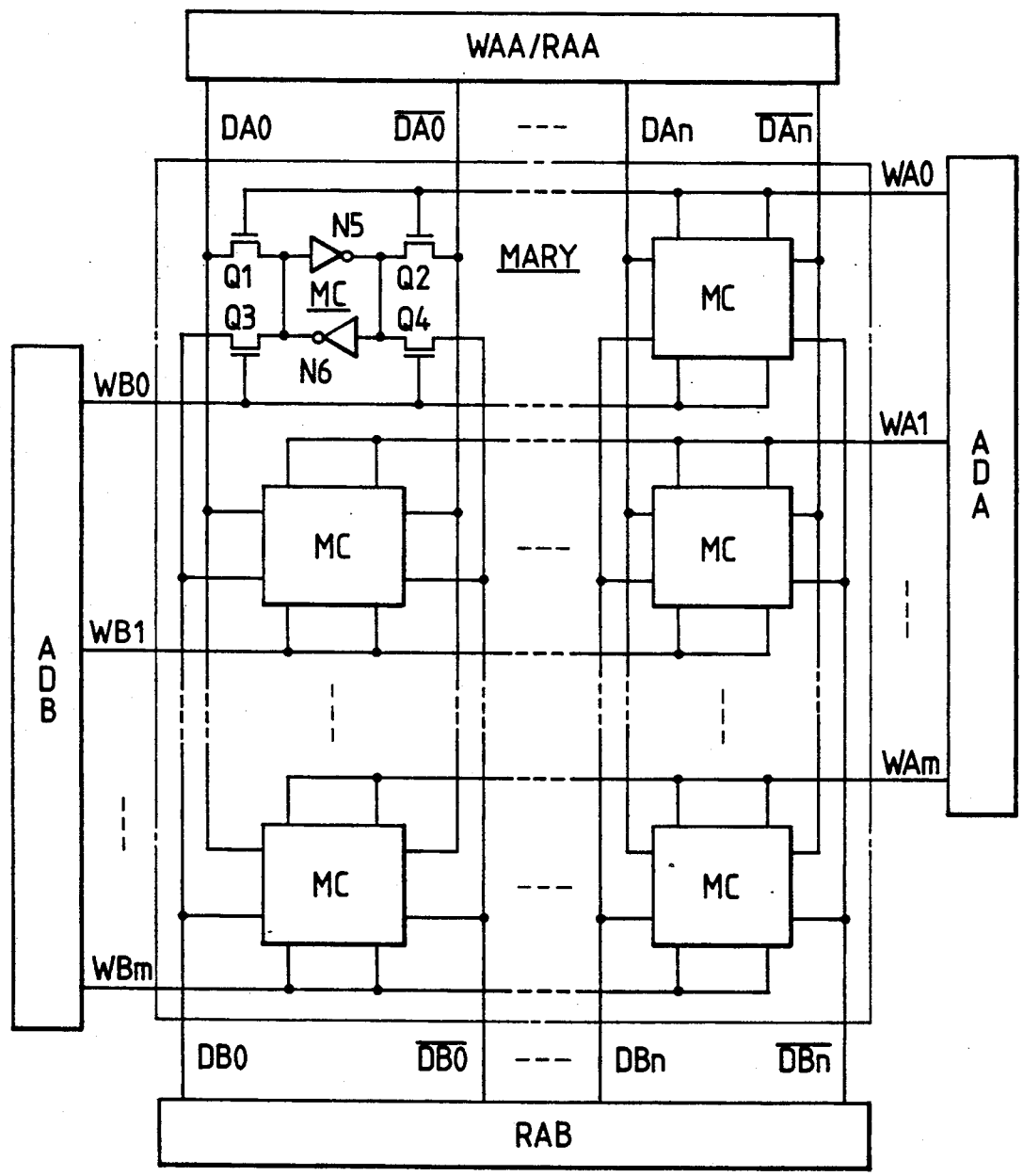

SEMICONDUCTOR MEMORY

BACKGROUND OF THE INVENTION

The present invention relates to a semiconductor memory. By way of example, it relates to techniques which are effective when utilized for a multiport memory etc. built in a gate-array integrated circuit etc.

A gate-array integrated circuit has a built-in multiport memory. The multiport memory is employed as, for example, a register file when the gate-array integrated circuit constitutes, for example, a digital processor such as computer.

The multiport memory is described in, for example, "IEEE 1987, Materials for CICC (Custom Integrated Circuits Conference)," pp. 195-198.

In the multiport memory (dual-port memory) having two ports as stated in the above literature, addresses designated by both the ports agree in some cases. When an operating condition arises, on occasion, during which both of the ports are set in a read mode, a read operation at the agreeing address is executed without any change, and the resulting read data is output. In addition, when both the ports are set in a write mode at this time, the write operation of either of the ports is inhibited so as to prevent an unspecified write condition from developing. Further, when one port is set in the write mode and the other port in the read mode, there is adopted a step wherein the read operation of the other port is inhibited or a step wherein the read operation of the other port is carried out at the point of time at which the write operation of one port has ended.

In a case where the multiport memory is employed as the register file of a computer or the like, one port is often used as a read-only port. Herein, in a case where the other port is set in the write mode and where the addresses designated by both the ports are in agreement, there is often adopted the aforementioned latter step wherein the read operation of one port is performed upon the end of the write operation of the other port.

With such a step, however, the wait time involved of the port set in the read mode becomes undesirably lengthened, resulting in a corresponding long access time of the multiport memory. For this reason, the operating speed of the computer or the like including the multiport memory becomes decreased thereby limiting the throughput capability thereof.

An object of the present invention is to provide a multiport memory from which the latest write data can be read at high speed even in a case where addresses designated by at least two ports are in agreement and where one port is set in a write mode, while the other port is set in a read mode. Another object of the present invention is to further enhance the throughput capability of a digital processor including a multiport memory.

The above and other objects and novel features of the present invention will become apparent from the description of this specification and the accompanying drawings.

SUMMARY OF THE INVENTION

A typical aspect of performance of the present invention is briefly summarized as follows: A multiport memory is furnished with a data selector by which, when addresses designated by at least two ports agree and one port and the other port are respectively set in a write mode and a read mode, write data to be supplied from one port is directly transmitted as read data for the other port through a path bypassing the memory array and read amplifier associated therewith.

According to the expedient stated above, even in the case where the addresses designated by the plurality of ports agree and where one port is set in the write mode, while the other port is set in the read mode, the latest write data can be transmitted to the other port without passing it through a memory cell. Therefore, the period of time required for the read operation of the multiport memory in such a case can be shortened, and the overall access time of the multiport memory can be shortened. Furthermore, a digital processor including the multiport memory is permitted to raise its operating speed and can enhance its throughput capability.

BRIEF DESCRIPTION OF THE DRAWINGS

FIG. 1 is a plan view of an embodiment of a semiconductor substrate formed with a multiport memory to which the present invention is applied;

FIG. 3 is a diagram showing an example of the internal arrangement of a timing generator TG;

FIG. 4 is a diagram showing an example of a memory array in the multiport memory to which the present invention is applied;

DESCRIPTION OF THE PREFERRED EMBODIMENTS

Shown in FIG. 1 is a plan view of an embodiment of a semiconductor substrate (IC CHIP) formed with a multiport memory to which the present invention is applied. Although not especially restricted, the multiport memory in this embodiment is built in a digital processor such as single-chip type microcomputer. Various circuit blocks constituting the digital processor are formed on the single semiconductor substrate made of single-crystal silicon by known techniques for manufacturing CMOS (complementary MOS) integrated circuits, though no special restriction is meant.

Referring to FIG. 1, a plurality of bonding pads BP are disposed in the peripheral region of the semiconductor substrate. These bonding pads BP are coupled to corresponding external terminals through pieces of bonding wire or the like. Some of the bonding pads BP are coupled to the corresponding unit circuits of input-/output circuits or I/O buffers which are formed at the end parts of the semiconductor substrate.

The input/output circuits I/O accept various input digital signals supplied from external devices, and transmit them to the corresponding internal circuits of the digital processor. In addition, the circuits I/O send various output digital signals delivered from the corresponding internal circuits of the digital processor, to the external devices.

In most of the semiconductor substrate, there is formed the logic circuit portion LC of the digital processor including an arithmetic-logic unit ALU, first and second memory control circuits MCC1 and MCC2 which decode address signals etc. from the arithmetic-logic unit ALU and supply the decoded signals to the multiport memory, and various control units. The multiport memory (DM) in this embodiment is formed at a predetermined position surrounded with the logic circuit portion LC. Although not especially limited thereto, the multiport memory is used as the register file of the digital processor.

Figure 6:
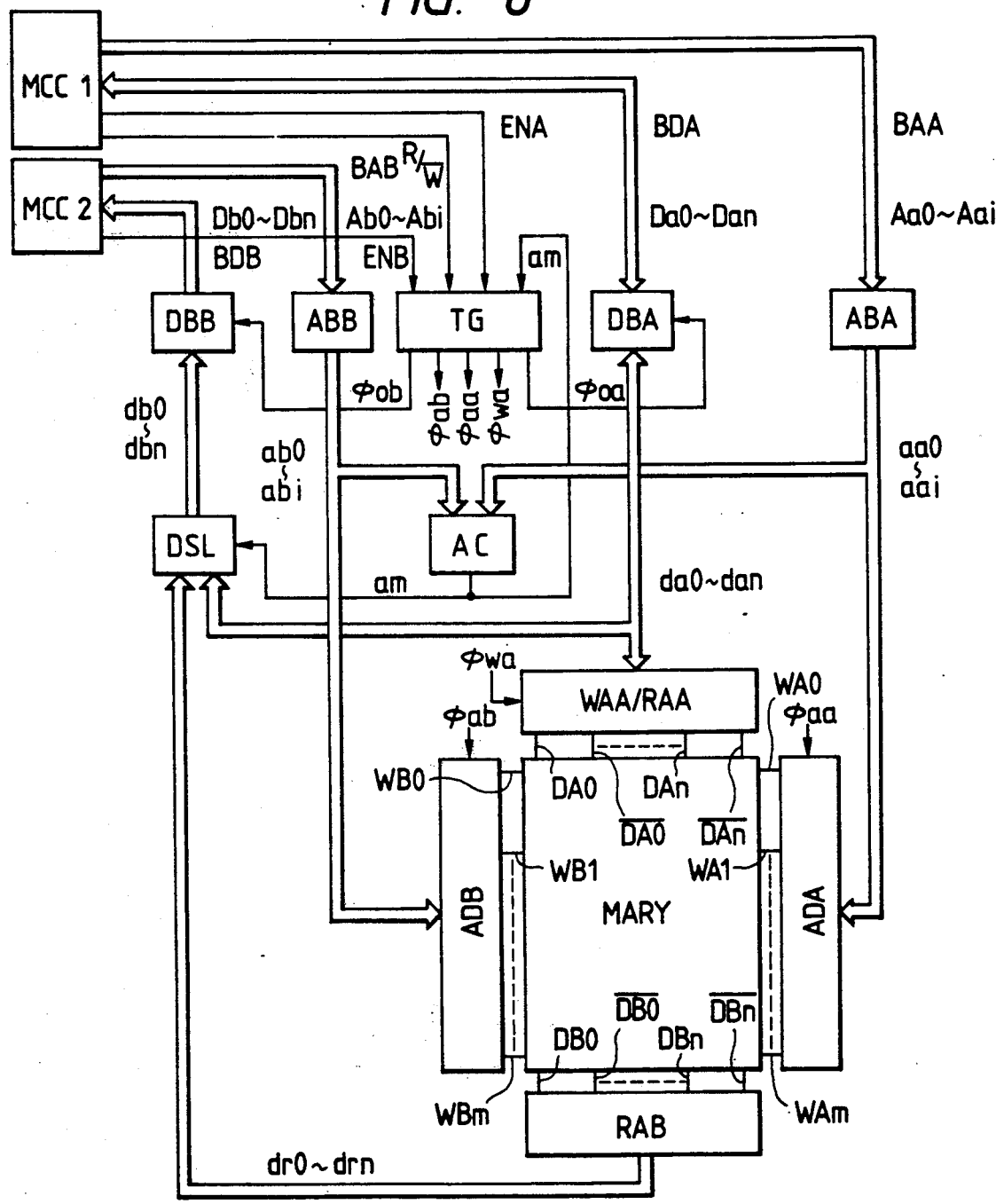
FIG. 6 is a block diagram showing an embodiment of the multiport memory to which the present invention is applied.

FIG. 6 is a block diagram showing an embodiment of the multiport memory to which the present invention is applied. Although no special restriction is, it is not to be construed as being limited thereto the multiport memory of this embodiment is built in a standard gate-array integrated circuit. The gate-array integrated circuit has some manufacturing masks formed optionally, thereby to construct the digital processor such as computer conforming to user specifications.

The multiport memory of this embodiment is coupled to the first memory control circuit MCC1 of the digital processor through an address bus BAA, a data bus BDA, and control buses such as an enable signal line ENA and a read/write signal line R/$\overline{W}$, while it is coupled to the second memory control circuit MCC2 of the digital processor through an address bus BAB, a data bus BDB, and a control bus such as enable signal line ENB. Thus, the multiport memory of this embodiment functions as a dual-port memory which is accessible through the first and second memory control circuits MCC1 and MCC2 independently of each other. Although it is not restricted thereto, the port A of the dual-port memory coupled to the address bus BAA, etc. is constructed as an input/output port capable of both a write operation and a read operation, and the port B thereof coupled to the address bus BAB, etc. is constructed as a read-only port. The operation mode of the port A is designated by a read/write signal R/$\overline{W}$.

In the embodiment of FIG. 6, the multiport memory, although it is not particularly limited hereto, is basically constructed of a memory array MARY in which static memory cells are arranged in a matrix shape, An address decoder ADA is supplied with address signals of (i+1) bits aa0-aai from an address buffer ABA to be described later, and is also supplied with a timing signal $\phi$aa from a timing generator TG to be described later. Likewise, an address decoder ADB is supplied with address signals of (i+1) bits ab0-abi from an address buffer ABB to be described later and is also supplied with a timing signal $\phi$ab from the timing generator TG.

The address decoder ADA is selectively brought into an operating state in such a way that the timing signal $\phi$aa is set at a high level. In the operating state, the address decoder ADA decodes the address signals aa0-aai supplied from the address buffer ABA and selectively brings the corresponding one of the word lines WA0-WAm of the memory array MARY into a selected state of high level. Likewise, the address decoder ADB is selectively brought into an operating state in such a way that the timing signal $\phi$ab is set at a high level. In the operating state, the address decoder ADB decodes the address signals ab0-abi and selectively brings the corresponding one of the word lines WB0-WBm of the memory array MARY into a selected state of high level.

The address buffer ABA accepts and holds address signals Aa0-Aai which are supplied through the address bus BAA from the first memory control circuit MCC1 of the digital processor. Then, the address buffer ABA supplies the address signals aa0-aai to the address decoder ADA and also supplies them to the input terminals of an address comparator AC on one side as will be described later. Likewise, the address buffer ABB accepts and holds address signals Ab0-Abi which are supplied through the address bus BAB from the second memory control circuit MCC2 of the digital processor. Then, the address buffer ABB supplies the address signals ab0-abi to the address decoder ADB and also supplies them to the input terminals of the address comparator AC on the other side.

The address comparator AC compares the address signals aa0-aai and ab0-abi which are respectively supplied from the address buffers ABA and ABB. When all the address signals supplied to the address comparator AC agree, an address agreement detection signal am is rendered a high level. On the other hand, when the respectively corresponding address signals supplied to the address comparator AC do not agree even at one bit, the address agreement detection signal am is rendered a low level.

The complementary data lines DA0, $\overline{DA0}$-DAn, $\overline{DAn}$ of the memory array MARY are respectively coupled to the corresponding unit circuits of a write amplifier WAA and a read amplifier RAA. Likewise, the complementary data lines DB0, $\overline{DB0}$-DBn, $\overline{DBn}$ of the memory array MARY are respectively coupled to the corresponding unit circuits of a read amplifier RAB.

Each of the write amplifier WAA and the read amplifier RAA includes (n+1) number of unit circuits of. The input terminals of the unit circuits of the write amplifier WAA are respectively coupled to the corresponding bits of a data buffer DBA, while the output terminals thereof are respectively coupled to the corresponding complementary data lines DA0, $\overline{DA0}$-DAn, $\overline{DAn}$ of the memory array MARY. The input terminals of the unit circuits of the read amplifier RAA are respectively coupled in common to the output terminals of the corresponding unit circuits of the write amplifier WAA, while the output terminals thereof are respectively coupled in common to the input terminals of the corresponding unit circuits of the write amplifier WAA. A timing signal $\phi$wa from the timing generator TG is supplied to all the unit circuits of the write amplifier WAA in common.

The respective unit circuits of the write amplifier WAA are selectively brought into operating states in such a way that the port A of the multiport memory is brought into a selected state as the write mode and that the timing signal $\phi$wa is set at a high level. In the operating states, the respective unit circuits of the write amplifier WAA form complementary write signals conforming to write data items da0-dan supplied from the data buffer DBA and transmit them to the corresponding complementary data lines DA0, $\overline{DA0}$-DAn, $\overline{DAn}$ of the memory array MARY. Thus, the write data items da014 dan are written into the (n+1) memory cells which are coupled to the selected one of the word lines WA014 WAm of the memory array MARY. The write data items da0-dan delivered from the data buffer DBA are also supplied to the input terminals of a data selector DSL on one side as will be described later.

When the port A of the multiport memory is brought into a selected state as the read mode, the respective unit circuits of the read amplifier RAA amplify read signals delivered through the corresponding complementary data lines DA0, $\overline{DA0}$-DAn, $\overline{DAn}$ from the (n+1) memory cells coupled to the selected one of the word lines WA0-WAm of the memory array MARY and transmit them to the data buffer DBA as read data da0-dan. The read data items da0-dan delivered from the read amplifier RAA are also supplied to the input terminals of the data selector DSL on one side.

Meanwhile, the read amplifier RAB similarly includes (n+1) unit circuits. The input terminals of these unit circuits are respectively coupled to the corresponding complementary data lines DB0, $\overline{DB0}$-DBn, $\overline{DBn}$ of the memory array MARY, while the output terminals thereof are respectively coupled to the input terminals of the data selector DSL at corresponding bits on the other side as will be described later.

When the port B of the multiport memory is brought into a selected state, the respective unit circuits of the read amplifier RAB amplify read signals delivered through the corresponding complementary data lines DB0, $\overline{DB0}$-DBn, $\overline{DBn}$ from the (n+1) memory cells coupled to the selected one of the word lines WB0-WBm of the memory array MARY and transmit them to the input terminals of the data selector DSL on the other side as read data dr0-drn.

When the address signals aa0-aai supplied from the address buffer ABA and the address signals ab0-abi supplied from the address buffer ABB do not agree even at one bit wherein the address agreement detection signal am is set at the low level, the data selector DSL selects the read data items dr0-drn supplied from the read amplifier RAB of the corresponding port B and transmits the read data to a data buffer DBB. In contrast, when the address signals aa0-aai and those ab0-abi agree at all the bits wherein the address agreement detection signal am is set at the high level, the data selector DSL operates as follows: In the case where the port A is set in the write mode, the data selector DSL selects the write data items da0-dan supplied from the data buffer DBA of the port A and transmits them to the data buffer DBB as read data db0-dbn. In the case where the port A is set in the read mode on this occasion, the data selector DSL selects the read data items da0-dan supplied from the read amplifier RAA of the port A and transmits the read data to the data buffer DBB as the read data db0-dbn.

The data buffer DBA includes (n+1) data input buffers and data output buffers. Among them, the data input buffers have their input terminals respectively coupled to the corresponding bits of the data bus BDA and have their output terminals respectively coupled to the input terminals of the corresponding unit circuits of the write amplifier WAA, namely, the output terminals of the corresponding unit circuits of the read amplifier RAA. On the other hand, the data output buffers of the data buffer DBA have their input terminals respectively coupled in common to the output terminals of the corresponding unit circuits of the read amplifier RAA, namely, the output terminals of the corresponding data input buffers and have their output terminals respectively coupled in common to the corresponding bits of the data bus BDA, namely, the input terminals of the corresponding data input buffers. All the data output buffers are supplied in common with a timing signal $\phi$oa from the timing generator TG.

When the port A is brought into the selected state as the write mode, the data input buffers of the data buffer DBA sets the write data items da0-dan as complementary write signals and transmits them to the write amplifier WAA. When the port A is held in a non-selected state or is set in the read mode, the outputs of all the data input buffers of the data buffer DBA are held in high impedance states.

The data output buffers of the data buffer DBA are selectively brought into operating states in such a way that the port A is set in the selected state as the read mode and that the timing signal $\phi$oa is rendered a high level. In the operating states, the respective data output buffers transmit read data items Da0-Dan to the first memory control circuit MCC1 of the digital processor through the data bus BDA. When the timing signal $\phi$oa is held at a low level, the outputs of all the data output buffers of the data buffer DBA are held in high impedance states.

Likewise, the data buffer DBB includes (n+1) data output buffers. The input terminals of these data output buffers are respectively coupled to the output terminals of the corresponding inverter circuits N1-N3 of the data selector DSL to be described later, while the output terminals thereof are respectively coupled to the corresponding bits of the data bus BDB. All the data output buffers of the data buffer DBB are supplied in common with a timing signal $\phi$ob from the timing generator TG.

The data output buffers of the data buffer DBB are selectively brought into operating states in such a way that the port B is set in the selected state and that the timing signal $\phi$ob is rendered a high level. In the operating states, the respective data output buffers transmit read data items Db0-Dbn to the second memory control circuit MCC2 of the digital processor through the data bus BDB. When the timing signal $\phi$ob is held at a low level, the outputs of all the data output buffers of the data buffer DBB are held in high impedance states.

FIG. 4 is a diagram showing an example of the memory array of the multiport memory to which the present invention is applied.

As shown in FIG. 4, the memory array MARY includes the word lines WA0-WAm and WB0-WBm which are arranged in parallel in the horizontal direction and the complementary data lines DA0, $\overline{DA0}$--DAn, $\overline{DAn}$ and DB0, $\overline{DB0}$-DBn, $\overline{DBn}$ which are arranged in parallel in the vertical direction. At the intersection points between the word lines and the complementary data lines, the memory cells MC numbering (m+1)×(n+1) are arranged in the shape of a matrix.

As exemplified in FIG. 4, each of the memory cells MC of the memory array MARY includes two CMOS inverter circuits N5 and N6 the inputs terminals and output terminals of which are cross-connected to each other. These inverter circuits constitute a latch which serves as the storage element of the memory cell MC. The input/output nodes of the latches of the (m+1) memory cells MC arranged in the identical column of the memory array MARY are respectively coupled in common to the non-inverted signal line and inverted signal line of the corresponding pair of the complementary data lines DA0, $\overline{DA0}$-DAn, $\overline{DAn}$ through transfer gate MOSFETs Q1 and Q2 of the N-channel type. In addition, they are respectively coupled in common to the non-inverted signal line and inverted signal line of the corresponding pair of the complementary data lines DB0, $\overline{DB0}$-DBn, $\overline{DBn}$ through similar transfer gate MOSFETs Q3 and Q4 of the N-channel type. On the other hand, the gates of the transfer gate MOSFETs Q1, Q2 and Q3, Q4 of the (n+1) memory cells MC arranged in the identical row of the memory array MARY are respectively coupled in common to the corresponding ones of the word lines WA0-WAm and the word lines WB0-WBm.

Thus, the input/output nodes of the latches of the memory cells MC in the identical row are selectively coupled to the complementary data lines DA0, $\overline{DA0}$--DAn, $\overline{DAn}$ corresponding to the memory cells in such a way that one of the word lines WA0-WAm corresponding to the row is selectively brought into the selected state of high level. In addition, they are selectively coupled to the corresponding complementary data lines DB0, $\overline{DB0}$-DBn, $\overline{DBn}$ in such a way that the corresponding one of the word lines WB0-WBm is selectively brought into the selected state of high level.

The word lines WA0-WAm of the memory array MARY are coupled to the address decoder ADA, and they are respectively placed into the selected state in accordance with applying thereat a high level signal. Likewise, the word lines WB0-WBm of the memory array MARY are coupled to the address decoder ADB, and they are respectively placed into the selected state in accordance with applying thereat a high level signal.

Figure 2:
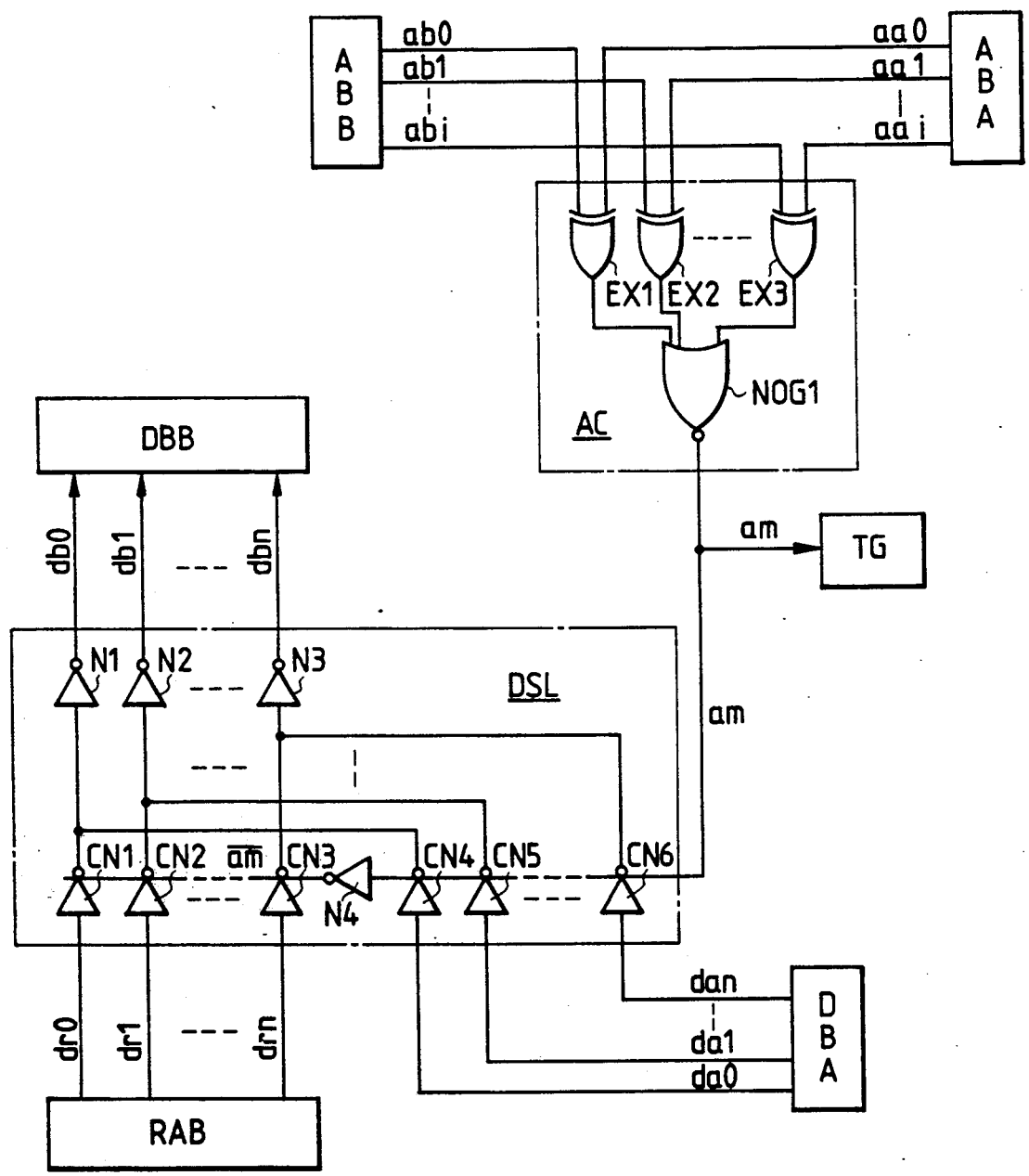
FIG. 2 is a circuit diagram showing an embodiment of an address comparator as well as a data selector in the multiport memory to which the present invention is applied.

FIG. 2 is a circuit diagram showing an embodiment of the address comparator as well as the data selector in the multiport memory to which the present invention is applied.

The address comparator AC includes (i+1) exclusive-OR circuits EX1-EX3, and a NOR gate circuit NOG1 which receives the output signals of the exclusive-OR circuits EX1-EX3. One input terminal of each of the exclusive-OR circuits EX1-EX3 is supplied with the corresponding one of the address signals aa0-aai from the address buffer ABA. Besides, the other input terminal of each of these exclusive-OR circuits is supplied with the corresponding one of the address signals ab0-abi from the address buffer ABB. The output signals of the exclusive-OR circuits EX1-EX3 are respectively supplied to the corresponding input terminals of the NOR gate circuit NOG1. The output signal of the NOR gate circuit NOG1 is supplied to the timing generator TG and the data selector DSL as the output signal of the address comparator AC, namely, the address agreement detection signal am.

Each of the output signals of the exclusive-OR circuits EX1-EX3 of the address comparator AC is set at a high level when the corresponding ones of the address signals aa0-aai and the address signals ab0-abi do not agree. In contrast, it is set at a low level when the corresponding ones of the address signals aa0-aai and the address signals ab0-abi agree.

The output signal of the NOR gate NOG1, namely, the address agreement detection signal am is set at the low level when any of the output signals of the exclusive-OR circuits EX1-EX3 is the high level, in other words, when the address signals aa0-aai and those ab0-abi do not agree even at one bit. The address agreement detection signal am is set at the high level when all the output signals of the exclusive-OR circuits EX1-EX3 are the low level, in other words, when the address signals aa0-aai and those ab0-abi agree at all the bits.

The data selector DSL includes (n+1) clocked inverter circuits CN1-CN3, and (n+1) clocked inverter circuits CN4-CN6 and inverter circuits N1-N3 which are disposed in correspondence with the clocked inverter circuits CN1-CN3.

The input terminals of the clocked inverter circuits CN1-CN3 are respectively used as the input terminals of the data selector DSL on the other side (second input terminals) and are coupled to the output terminals of the corresponding unit circuits of the read amplifier RAB. Likewise, the input terminals of the clocked inverter circuits CN4-CN6 are respectively used as the input terminals of the data selector DSL on one side, first input terminals and they are respectively coupled in common to the output terminals of the corresponding unit circuits of the read amplifier RAA, namely the input terminals of the corresponding unit circuits of the write amplifier WAA. The output terminals of the clocked inverter circuits CN1-CN3 are respectively coupled to the output terminals of the corresponding clocked inverter circuits CN4-CN6, and further coupled in common to the input terminals of the corresponding inverter circuits N1-N3. The clock input terminals of all the clocked inverter circuits CN4-CN6 are supplied in common with the above-stated address agreement detection signal am from the address comparator AC. In addition, the clock input terminals of all the clocked inverter circuits CN1-CN3 are supplied in common with the inverted signal of the address agreement detection signal am as produced by an inverter circuit N4, in other words, an inverted address agreement detection signal $\overline{am}$. The output signals of the inverter circuits N1-N3 are used as the read data db0-dbn, and are supplied to the data buffer DBB.

FIG. 3 is a diagram showing an example of the internal arrangement of the timing generator TG.

The timing generator TG has a timing generator circuit TGA for the port A, a timing generator circuit TGB for the port B, a CMOS inverter circuit N7, and a NOR gate circuit NOG2.

When the port A is brought into the selected state, the timing generator circuit TGA for the port A is supplied with the enable signal ENA of high level and the read/write signal R/$\overline{W}$ for setting an operation mode at that time, from the first memory control circuit MCC1. Upon receiving these signals, the timing generator circuit TGA for the port A forms the timing signal $\phi$aa of high level and the timing signals $\phi$aa and $\phi$wa whose level changes in accordance with the operation mode at that time.

When the port B is brought into the selected state, the timing generator circuit TGB for the port B is supplied with the enable signal ENB of high level from the second memory control circuit MCC2. Upon receiving this signal, the timing generator circuit TGB for the port B forms timing signals $\phi'$ab and $\phi$ob of high level.

The timing signal $\phi'$ab is supplied to the input terminal of the CMOS inverter circuit N7. The input terminals of the NOR gate circuit NOG2 are respectively supplied with a timing signal $\phi'$ab which is the output signal of the CMOS inverter circuit N7, and the address agreement detection signal am. Upon receiving these signals, the NOR gate circuit NOG2 forms the timing signal $\phi$ab.

The timing signal $\phi$ab is set at the high level when the port B is brought into the selected state, with the address agreement detection signal am being the low level. This timing signal $\phi$ab, however, is set at the low level when the address agreement detection signal am is the high level in spite of the selected state of the port B. In this case, notwithstanding that the port B is held in the selected state, the word line selecting operation by the address decoder ADB is not executed.

Next, there will be outlined an operation in the case where, in the multiport memory of this embodiment, the individual ports have been brought into the selected states independently.

Referring to FIG. 6, the port A of the multiport memory is brought into the selected state independently of the port B in response to the enable signal ENA being rendered a high level. On this occasion, the operation mode of the port A is selectively set in the write mode or the read mode in accordance with the read/write signal R/$\overline{\text{W}}$ as stated before.

When the port A is brought into the selected state as the read mode (with the read/write signal R/$\overline{\text{W}}$ set at the high level), the timing signal $\phi$aa is first rendered the high level and the timing signal $\phi$oa is rendered the high level somewhat later in the multiport memory.

Owing to the timing signal $\phi$aa rendered the high level, the operation of selecting any of the word lines WA0–WAm by the address decoder ADA is started. Since one of the word lines WA0–WAm of the memory array MARY is selectively brought into the selected state of high level, the transfer gate MOSFETs Q1 and Q2 of the (n+1) memory cells MC (in FIG. 4) coupled to this word line are simultaneously turned "on," and read signals conforming to the stored data of these memory cells MC are respectively delivered to the complementary data lines DA0, $\overline{\text{DA0}}$–DAn, $\overline{\text{DAn}}$. The read signals are amplified by the corresponding unit circuits of the read amplifier RAA, and are thereafter transmitted to the data buffer DBA as the read data da0–dan.

Owing to the timing signal $\phi$oa being rendered a high level, the data buffer DBA sends the read data Da0–Dan to the first memory control circuit MCC1 of the digital processor through the data bus BDA.

On the other hand, when the port A of the multiport memory is brought into the selected state as the write mode (with the read/write signal R/$\overline{\text{W}}$ set at the low level), the timing signal $\phi$aa is first rendered at a high level and the timing signal $\phi$wa is rendered at a high level somewhat later in the multiport memory. The write amplifier WAA is supplied with the write data da0–dan from the data buffer DBA.

Owing to the timing signal $\phi$aa being rendered a high level, the address decoder ADA is brought into the operating state, and the operation of selecting any of the word lines WA0–WAm of the memory array MARY is started as in the read mode. Thus, the corresponding one of the word lines WA0–WAm is selectively brought into the selected state, and the (n+1) memory cells MC coupled to this word line are respectively coupled to the corresponding complementary data lines DA0, $\overline{\text{DA0}}$–DAn, $\overline{\text{DAn}}$ through the corresponding transfer gate MOSFETs Q1 and Q2.

When the timing signal $\phi$wa is set at a high level, the respective unit circuits of the write amplifier WAA form complementary write signals conforming to the transmitted write data da0–dan and transmit them to the complementary data lines DA0, $\overline{\text{DA0}}$–DAn, $\overline{\text{DAn}}$ of the memory array MARY. Thus, the write data items da0–dan are written into the (n+1) memory cells MC coupled to the selected word line.

Similarly to the foregoing, the port B of the multiport memory is brought into the selected state independently of the port A in response to the enable signal ENB rendered the high level. Then, the port B is set in the read mode. Thus, the timing signals $\phi$ab and $\phi$ob are rendered a high level with a predetermined time difference.

Since the timing signal $\phi$ab is set at a high level, one of the word lines WB0–WBm of the memory array MARY is selectively brought into the selected state, and read signals conforming to the stored data of the (n+1) memory cells Mc coupled to this word line are delivered to the corresponding complementary data lines DB0, $\overline{\text{DB0}}$–DBn, $\overline{\text{DBn}}$. These read signals are amplified by the corresponding unit circuits of the read amplifier RAB, and are transmitted to the input terminals of the data selector DSL on the other side.

Since the port B of the multiport memory is solely held in the selected state, the data selector DSL transmits the read data dr0–drn delivered from the read amplifier RAB of the port B, to the data buffer DBB as the read data db0–dbn.

Owing to the timing signal $\phi$ob being rendered a high level, the data buffer DBB sends the read data Db0–Dbn to the second memory control circuit MCC2 of the digital processor through the data bus BDB.

As described above, the multiport memory of this embodiment is provided with the two ports A and B which are accessible independently of each other, and the address decoders ADA and ADB are disposed in correspondence with these ports.

Besides, as stated before, the multiport memory of this embodiment is used as the register file of the digital processor such as a computer. Therefore, the ports A and B can be simultaneously brought into the selected states ordinarily according to the system clock of the computer or the like.

Figure 5:
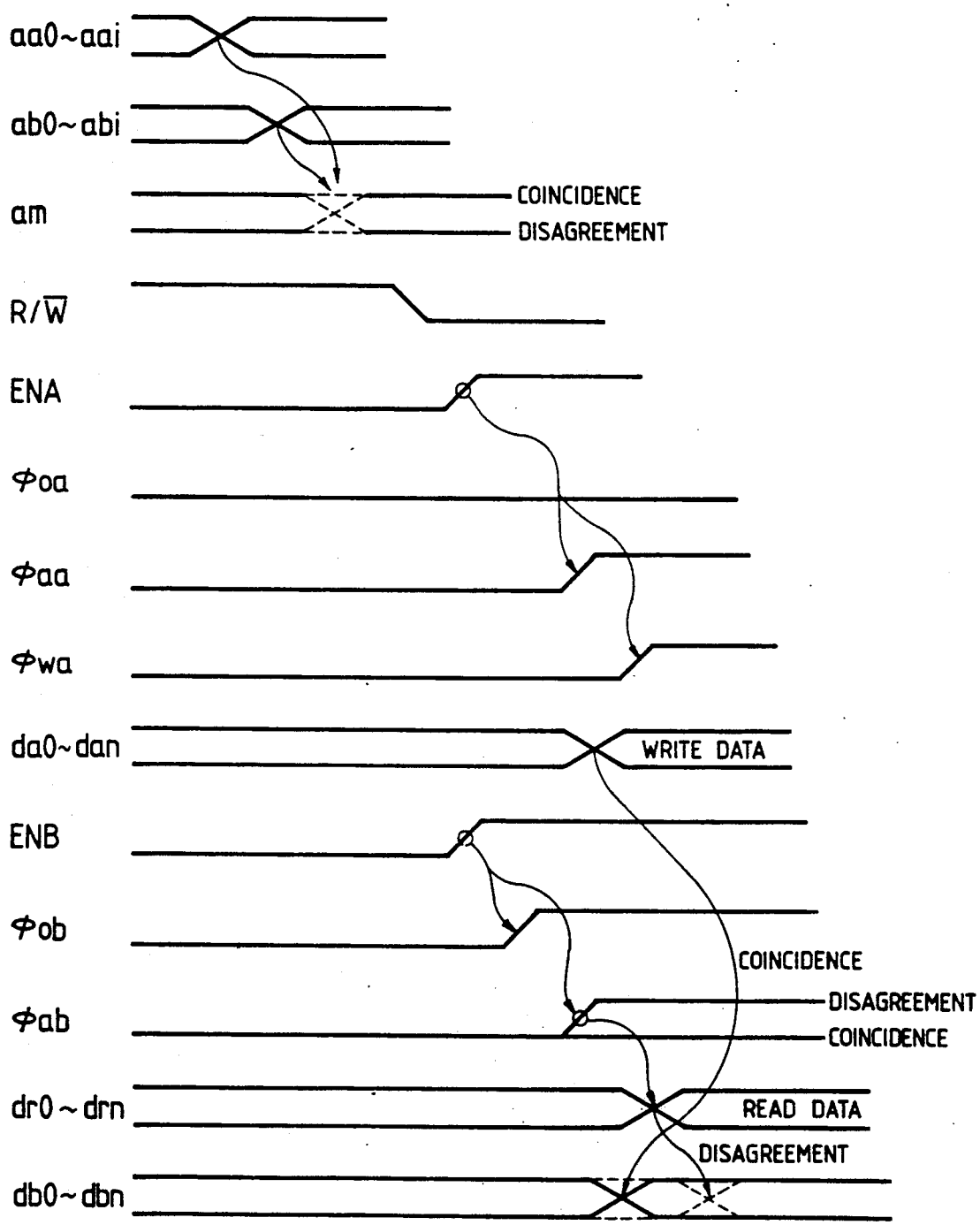
FIG. 5 is a schematic timing chart in the case where ports have been simultaneously brought into selected states.

Here, an example of an operation in the multiport memory of this embodiment will be described with reference to a schematic timing chart of FIG. 5 in the case where both the ports have been simultaneously brought into the selected states.

In response to the enable signal ENA being rendered a high level, the port A of the multiport memory is brought into the selected state. On this occasion, the operation mode of the port A is set in the write mode because the read/write signal R/$\overline{\text{W}}$ is at a low level. Likewise, in response to the enable signal ENB being rendered a high level, the port B of the multiport memory is also brought into the selected state. The operation mode of the port B is set in the read mode.

In the port A, after the enable signal ENA has become a high level, the timing signals, $\phi$aa and $\phi$wa are set at a high level in succession while being somewhat lagging. Since the timing signal $\phi$oa is rendered a low level, the data buffer DBA supplies the write data da0–dan to the write amplifier WAA and to the input terminals of the data selector DSL on one side (first input terminals).

Since the timing signal $\phi$aa is rendered a high level, the address decoder ADA is placed at an operating state so as to start the operation of selecting one of the word lines WA0–WAm of the memory array MARY. Thus, the corresponding one of the word lines WA0–WAm of the memory array MARY is selectively brought into the selected state, and the (n+1) memory cells MC coupled to this word line are respectively coupled to the corresponding complementary data lines DA0, $\overline{\text{DA0}}$–DAn, $\overline{\text{DAn}}$ through the corresponding transfer gate MOSFETs Q1 and Q2.

When the timing signal $\phi$wa is set at the high level, the respective unit circuits of the write amplifier WAA form complementary write signals conforming to the write data da0–dan and transmit them to the complementary data lines DA0, $\overline{\text{DA0}}$–DAn, $\overline{\text{DAn}}$ of the memory array MARY. Thus, the write data items da0–dan are written into the (n+1) memory cells MC coupled to the selected word line.

Regarding the port B of the multiport memory, after the enable signal ENB has been rendered the high level, the timing signal φob is set at the high level with a predetermined time difference. The timing signal φab is rendered a high level somewhat later than the timing signal φob when the address signals aa0–aai and ab0–abi supplied from the respective address buffers ABA and ABB of both of the ports to the address comparator AC do not agree, thereby rendering the address agreement detection signal am a low level Since the timing signal φab is set at the high level, one of the word lines WB0–Wbm of the memory array MARY is selectively brought into the selected state, and read signals conforming to the stored data of the (n+1) memory cells Mc coupled to this word line are delivered to the corresponding complementary data lines DB0, $\overline{DB0}$–DBn, $\overline{DBn}$. These read signals are amplified by the corresponding unit circuits of the read amplifier RAB, and are transmitted to the input terminals of the data selector DSL on the other side (second input terminals).

The data selector DSL transmits the read data dr0–drn transmitted from the read amplifier RAB of the port B, to the data buffer DBB as the read data db0–dbn for the port B.

In contrast, the timing signal φab is maintained at a low level state when the address signals aa0–aai and ab0–abi supplied from the respective address buffers ABA and ABB of both of the ports to the address comparator AC agree since the address agreement detection signal am is rendered a high level. At that time, the data selector DSL transmits the write data da0–dan supplied from the data buffer DBA of the port A, to the data buffer DBB as the read data db0–dbn for the port B through a separate path and via the data selector thereby bypassing the memory array, including the write-in paths of the pairs of data lines, and the corresponding reading operation associated therewith. On this occasion, although not particularly limited thereto, only the write operation is performed in the port A, and the word line selecting operation by the address decoder ADB of the port B and the amplifying operation by the read amplifier RAB thereof are inhibited.

In response to the timing signal φob being rendered a high level, the data buffer DBB sends the read data DB0–DBn to the second memory control circuit MCC2 of the digital processor through the data bus BDB.

As described above, the address signals aa0–aai and ab0–abi which are supplied through corresponding the ports are respectively supplied to the corresponding address decoders, and they are also supplied to the address comparator AC so as to be compared and checked bit by bit. When, as a result, of such comparison both the of address signals agree at all the bits, the address agreement detection signal address coincidence detection signal, am is selectively set at the high level. Between the read amplifier RAB of the port B and the corresponding data buffer DBB, there is interposed the data selector DSL whose input terminals on the other side (second input terminals) receive the read data dr0–drn delivered from the read amplifier RAB of the port B and whose input terminals on one side (first input terminals) receive the write data da0–dan delivered from the data buffer DBA of the port A or the read data da0–dan delivered from the read amplifier RAA thereof. In a case where the port A is brought into the selected state as the write mode, while at the same time, the port B is brought into the selected state as the read mode, and besides, where addresses designated by both of the ports agree, so that the address agreement detection signal am is rendered a high level, the data selector DSL selects the write data da0–dan of port A as the read data db0–dbn for the port B and transmits them to the data buffer DBB. That is, the write data items da0–dan received from the port A are delivered as the read data of the port B without passing through the selected memory cells MC of the memory array MARY. Therefore, even in the case where the ports A and B been simultaneously set in the selected states as the write mode and the read mode, respectively, and where the addresses designated by both the ports are in agreement, the read data corresponding to the latest write data is delivered to the port B at a timing similar to that of the ordinary read operation. Thus, the access time of the multiport memory is shortened synthetically, and the throughput capability of the digital processor including the multiport memory is further enhanced.

As indicated in the foregoing embodiments, in a case where the present invention is applied to a semiconductor memory, such as multiport memory, which is built in a gate array integrated circuit or the like, the following effects are attained:

(1) The multiport memory is provided with a data selector by which, when addresses designated by at least two ports agree and one port is set in a write mode, while the other port is set in a read mode, write data supplied from one port is directly transmitted to the output circuit of the other port through a path which bypasses the memory array and reading amplifier associated therewith. That is, there is produced the effect that the write data supplied from one port can be delivered as the read data of the other port without passing through the selected memory cells of a memory array. When the addresses of the multiport memory are in agreement (2) Owing to the above item (1), even in the case where the addresses designated by the plurality of ports agree and where one port is set in the write mode, while the other port is set in the read mode, the read operation of the multiport memory can be rendered as fast as the ordinary read operation thereof. Accordingly, there is produced the effect that the access time of the multiport memory can effectively be shortened that is reduced artificially.

(3) Owing to the above items (1) and (2), there is produced the effect that the operating speed of a digital processor including the multiport memory can be improved thereby further enhancing the throughput capability thereof.

Although, in the above, the invention made by the inventors has been specifically described in conjunction with the accompanying embodiments, it is needless to say that the present invention is not restricted to the foregoing embodiments, but that it can be exemplified by other embodiments and variations thereof that are within the spirit and scope of the appended claims. By way of example, in the block diagram of FIG. 6, both of the ports A and B may well be set as input/output ports each being capable of a write operation and a read operation. Contrariwise, it is also allowed to set the port A as a write-only port and the port B as a read-only port. Besides, the multiport memory may well have three or more ports. Although, in the embodiments, only the word lines can be selected, a column address-group selector may be disposed to permit also the complementary data lines of the memory array MARY to be selected. The memory array MARY may well be configured of a plurality of memory mats, and the practicable arrangement of the memory cell MC is not restricted to the embodiment shown in FIG. 4. Besides, the memory array MARY in which the static memory cells MC are arranged in the matrix shape may well be replaced with an array in which standard flip-flops are arranged in the matrix shape. In FIG. 2, the address comparator AC may well be constructed by combining standard logical gate circuits without employing the exclusive-OR circuits stated before, if the address signals aa0-aai and ab0-abi are complementary signals. Similarly, the data selector DSL may well be constructed by combining standard logical gate circuits instead of the clocked inverter circuits. Further, the practicable circuit arrangements of the address comparator AC, data selector DSL and memory array MARY illustrated in FIGS. 2 and 4 can be adapted to various aspects of performance, and the block arrangement of the multiport memory and the combination of the address signals, control signals etc. as illustrated in FIG. 6 can be adapted to various aspects of performance.

Figure 7:
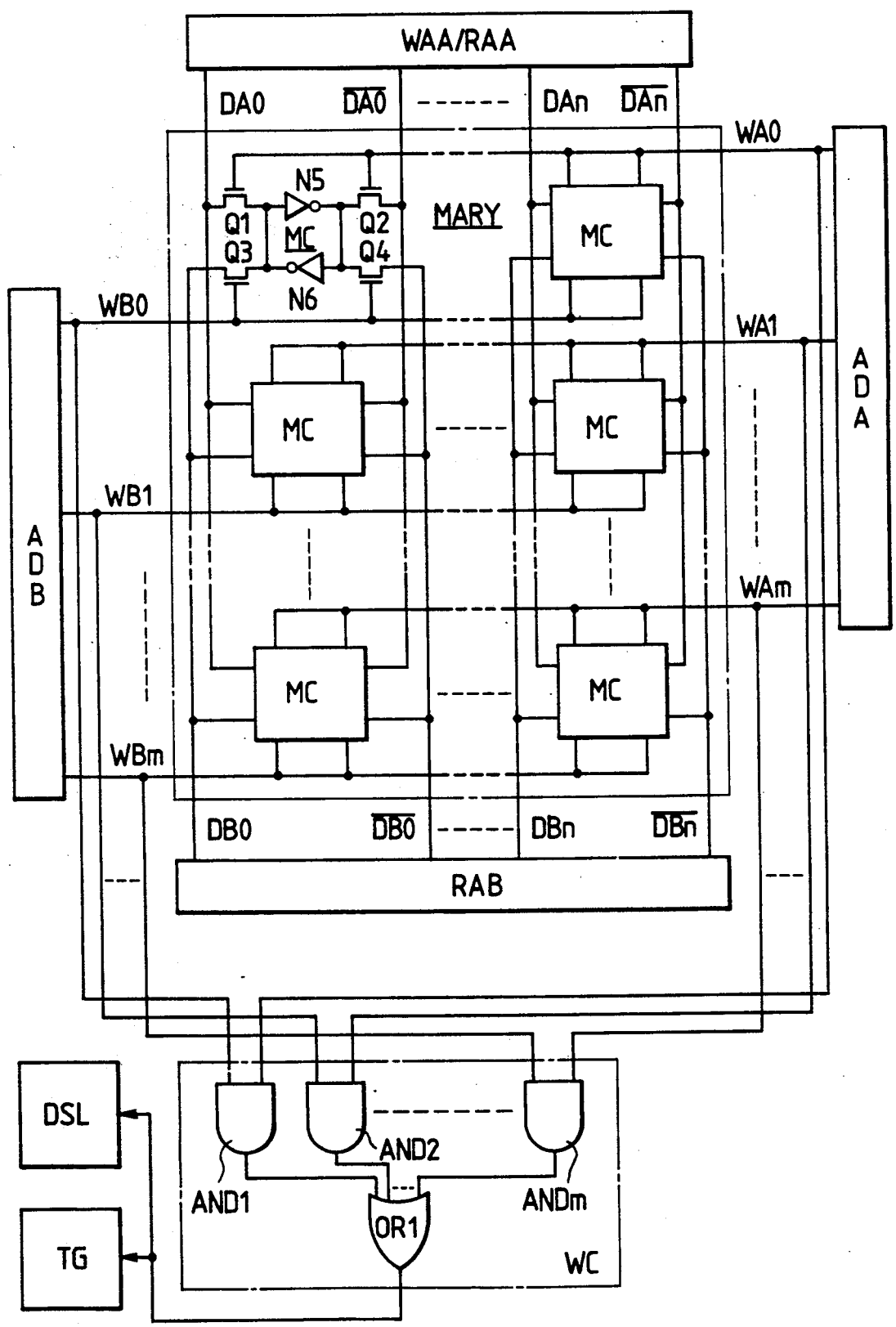
FIG. 7 is a diagram showing another embodiment in the present invention.

In addition, the present invention is not restricted to the method in which the address signals are compared for the agreement detection as explained in the embodiments, but it may well adopt a method in which the level of a selected word line is detected as illustrated in FIG. 7. By way of example, a word line level comparator WC in this figure includes 2-input AND gate circuits AND1-ANDm each of which has the corresponding one of word lines WAi (i=0, 1, ... m) coupled to one input terminal thereof and has the corresponding one of word lines WBj (j=0, 1, ... m) coupled to the other input terminal thereof, and an OR gate circuit OR1 which receives the output signals of all the 2-input AND gate circuits AND1-ANDm. The output signal of the OR gate circuit OR1 is supplied to the data selector DSL and the timing generator TG as explained in the embodiments.

In the above, the invention made by the inventors has been chiefly described in connection with application to a multiport memory built in a gate array integrated circuit with respect to a field of utilization. However, the invention is not restricted thereto, but it is also applicable to, for example, a multiport memory which is solely formed as such and similarly to multiport memories which are built in various other digital integrated circuits. The present invention can be extensively applied to a semiconductor memory which has, at least, a plurality of ports independently accessible at will or to a digital processor, e.g., a single-chip microcomputer in which such a semiconductor memory is built.

An effect which is attained by a typical aspect of performance of the present invention is briefly explained as follows: A multiport memory is furnished with a data selector according to which, when addresses designated by a plurality of ports agree and one port and the other port are respectively set in a write mode and a read mode, write data supplied from one port is directly transmitted as read data for the other port, whereby the read operation of the multiport memory in such a case can be rendered as fast as the ordinary read operation thereof, so that the access time of the multiport memory can be shortened for all practical purpose. Thus, the operating speed of a digital processor including the multiport memory can be improved thereby further enhancing the throughput capability thereof.

What is claimed is:

1. A semiconductor memory comprising:
    a memory array having a plurality of memory cells, a plurality of first and second word lines, and a plurality of pairs of data lines which are respectively arranged so that each of said memory cells is coupled to a first word line, a second word line and a corresponding pair of data lines;
    first decode means for selecting one of said plurality of first word lines in accordance with first address signals being supplied at inputs thereof, wherein when said one first word line is selected, the memory cells coupled thereto are supplied with data to-be-written through data input means;
    second decode means for selecting one of said plurality of second word lines in accordance with second address signals being supplied at inputs thereof;
    comparing means being responsive to said first and second address signals for providing at an output thereof a comparison signal indicative of either agreement or disagreement between said first and second address signals received;
    data output means being coupled to receive said comparison signal such that when said comparison signal is indicative of an agreement between the first and second address signals, said data to-be-written is outputted therefrom; and
    bypass means, coupling said data input means and said data output means, for supplying said data to-be-written from said data input means to said data output means, wherein in response to said comparison signal being indicative of an agreement between said first and second address signals, said data to-be-written is outputted from said data output means, bypassing said memory array.

2. A semiconductor memory according to claim 1, wherein said first address signals are write address signals, while said second address signals are read address signals.

3. A semiconductor memory according to claim 1, wherein said each memory cell is constructed of a flip-flop circuit which is configured of a plurality of MOSFETs.

4. A semiconductor memory according to claim 1, wherein said data output means includes at least one clocked inverter each one thereof having a control terminal coupled to receive a control signal, corresponding to said comparison signal, which is indicative of when the same memory cells are selected for both a data read mode and a data write mode of operation thereof.

5. A semiconductor memory according to claim 1, wherein said data output means has a first input coupled to receive predetermined data to-be-written, a second input coupled to receive read data outputted from said memory array, a control terminal coupled to receive a control signal, corresponding to said comparison signal, and has an output, and wherein said data output means is controlled by said control signal so that said data output means provides at said output thereof said 6. A semiconductor memory according to claim 5, wherein said memory array is at least a two-port controllably activated memory array in which a first port thereof through an input/output data bus has a write/read capability and a second port thereof via an output data bus has a read-only capability and which operates independently of said first port, and wherein there is further included a data input and output buffer means, correspondingly associated with said first port, for selectively either transmitting from said input/output data bus, via said data input buffer means, data to-be-written into selected memory cells of said memory array or transmitting, via said output buffer means and said input/output data bus, data read-out of selected memory cells of said memory array in accordance with address signals supplied by said first decode means.

7. A semiconductor memory according to claim 5, wherein said data output means includes:
a data selector circuit having at least one first input terminal, coupled to an output of a data input buffer included in said data input means and which is responsive to said predetermined data to-be-written, at least one second input terminal coupled to a read circuit of said memory array and having a control terminal for receiving said comparison signal outputted by said comparison means, and
a data output buffer having an input coupled to an output of said data selector circuit and an output for providing said data to-be-written as read data when the same memory cells in said memory array are selected as a result of a common address selection outputted by said first and second decode means at a common time period, and said data output buffer controllably providing read data outputted from said memory array.

8. A semiconductor memory according to claim 7, wherein said first decode means and said first address signals are correspondingly associated with a first port of a multi-port memory array, corresponding to said memory array, and said second decode means and said second address signals are correspondingly associated with a second port of said multi-port memory array.

9. A semiconductor memory according to claim 8, wherein with respect to said first port there is further included a data bus and write means for effecting at least a write mode capability, and with respect to said second port there is included memory array output means and a data output bus thereby effecting only a read mode capability of data information stored in said memory array.

10. A semiconductor memory according to claim 8, wherein with respect to said first port there is further included an input/output data bus and write/read means thereby effecting a write/read mode capability and with respect to said second port there is included memory array output means and a data output bus thereby effecting only a read mode capability of data information stored in said memory array.

11. A semiconductor memory according to claim 8, wherein said comparison signal is indicative of whether or not there is agreement between said first and second address signals upon a concurrent selection of both said first and second ports into an operation mode.

12. A semiconductor memory according to claim 11, wherein said data output buffer of said data output means is activated only when said second port is in an operation selection mode.

13. A semiconductor memory according to claim 12, wherein said data output buffer of said data output means is selectively activated in response to a phase control signal upon said second port becoming activated by a second port enable signal, and wherein said data selector circuit further includes means for selectively transmitting therethrough one of: said data to-be-written in response to receiving said comparison signal indicative of said agreement, said read data outputted from said memory array when said comparison signal is not indicative of an agreement at the time of operation of said multi-port memory array when both of said first and second ports are in an operation selection mode, and said read data outputted from said memory array when only said second port is in an operation selection mode.

14. A semiconductor memory according to claim 13, wherein said first port has an input/output data bus for effecting a write/read mode capability and there is coupled to said input/output data bus an inverse parallel coupling arrangement of said data input buffer and a second data output buffer for selectively either transmitting from said input/output data bus, via said data input buffer, data to-be-written into selected memory cells of said memory array or transmitting to said input/output data bus, via said second data output buffer, data read-out of selected memory cells of said memory array in accordance with address signals supplied by said first decode means upon selection of said first port into an operation mode and during such time periods as when both said first and second ports are in an operation selection mode except when said comparison signal is indicative of an agreement between said first and second address signals wherein a read mode associated with said first port is effected when said comparison signal is indicative of an agreement, through said data selector circuit, via said first input terminal thereof, and said data output buffer of said data output means, thereby bypassing said memory array.

15. A semiconductor memory according to claim 14, wherein said first input of said data selector circuit corresponds to a plurality of first input terminals equal in number to the number of bits associated with each input data to-be-written when said first port is in an operation selection mode, and wherein said second input thereof corresponds to a plurality of second input terminals equal in number to the number of memory array columns associated with each read-out operation corresponding to said second port, each said memory array column corresponding to a respective one of said pairs of data lines and each pair thereof being a complementary pair of data lines.

16. A semiconductor memory according to claim 14, wherein there is further included write/read means coupled between the inverse parallel coupling arrangement of said data input buffer and said second data output buffer and said plurality of pairs of data lines of said memory array, and wherein said bypass means connects the output of said data input buffer and input of said second data output buffer, to the first input terminals of said data selector circuit.

17. A semiconductor memory comprising:
a memory array having a plurality of memory cells, a plurality of first and second word lines, and a plurality of pairs of data lines which are respectively arranged so that each of said memory cells is coupled to a first word line, a second word line and a corresponding pair of data lines;
first decode means for selecting one of said plurality of first word lines in accordance with first address signals being supplied at inputs thereof, wherein when said one first word line is selected, the memory cells coupled thereto are supplied with write data through data input means and corresponding pairs of data lines;

second decode means for selecting one of said plurality of second word lines in accordance with second address signals being supplied at inputs thereof, wherein when said one second word line is selected, the memory cells coupled thereto supply read data;

comparing means being responsive to said first and second address signals for providing at an output thereof a comparison signal indicative of either agreement or disagreement between said first and second address signals received;

select means having inputs coupled to receive read data corresponding to data stored in said memory array and write data to be written in said memory array, having a control input for receiving said comparison signal, and having an output, wherein said select means provides said write data at said output thereof in response to said comparison signal indicating agreement between said first and second address signals, and wherein said select means provides said read data at said output thereof in response to said comparison signal indicating disagreement between said first and second address signals; and bypass means for supplying said write data directly from said data input means to said select means wherein in accordance with said comparison signal indicating agreement between said first and second address signals, said write data is transmitted as read data through said select means to said output thereof, bypassing said plurality of data line pairs.

18. A semiconductor memory according to claim 17, wherein said first address signals are write address signals, while said second address signals are read address signals.

19. A semiconductor memory according to claim 17, wherein said each memory cell is constructed of a flip-flop circuit which is configured of a plurality of MOSFETs.

20. A semiconductor memory according to claim 17, wherein said select means includes at least one clocked inverter each one thereof having a control terminal coupled to receive a control signal, corresponding to said comparison signal, which is indicative of when the same memory cells are selected for both a data read mode and a data write mode of operation thereof.

21. A semiconductor memory comprising:
a memory array having a plurality of memory cells, a plurality of first and second word lines, and a plurality of pairs of first and second data lines which are respectively arranged so that each of said memory cells is coupled to a first word line, a second word line and a corresponding pair of data lines;
first control means for supplying first address signals and write data;
second control means for supplying second address signals and receiving read data;
first decode means for selecting one of said plurality of first word lines in accordance with said first address signals being supplied at inputs thereof, wherein when said one word line is selected, the memory cells coupled thereto are supplied with write data from said first control means through data input means;
second decode means for selecting one of said plurality of second word lines in accordance with said second address signals being supplied at inputs thereof, wherein when said one word line is selected, the memory cells coupled thereto supply read data to a read output of said memory array;

comparing means being responsive to said first and second address signals for providing at an output thereof a comparison signal indicative of either agreement or disagreement between said first and second address signals received; and data selection and output means having inputs coupled to receive said write data supplied from said first control means and said read data outputted from said memory array and having a control input for receiving said comparison signal such that when said comparison signal is indicative of an agreement between said first and second address signals, said write data is selected and outputted therefrom and supplied to said second control means, and when said comparison signal is not indicative of an agreement between said first and second address signals said read data is selected and outputted therefrom to said second control means, wherein data is supplied to said data selection and output means directly from said data input means through a bypass means so that when said comparison signal is indicative of an agreement between said first and second address signals, said write data is supplied as read data through said data selection and output means to said second control means, bypassing said memory array.

22. A semiconductor memory according to claim 21, wherein said first address signals are write address signals, while said second address signals are read address signals.

23. A semiconductor memory according to claim 21, wherein said each memory cell is constructed of a flip-flop circuit which is configured of a plurality of MOSFETs.

24. A semiconductor memory according to claim 21, wherein said data selection and output means is comprised of a selection circuit of at least one clocked inverter each one thereof having a control terminal coupled to receive a control signal, corresponding to said comparison signal, which is indicative of when the same memory cells are selected for both a data read mode and a data write mode of an operation thereof.

25. A semiconductor memory according to claim 21, wherein said data selection and output means has a first input coupled to receive said write data to-be-written in said memory array, a second input coupled to receive read data outputted from said memory array. a control terminal coupled to receive a control signal, corresponding to said comparison signal, and has an output, and wherein said data selection and output means is controlled by said control signal so that said data selection and output means provides at said output thereof said write data to-be-written in response to said control signal indicating that memory cells selected of said memory array for both a data read mode and a data write mode, of operation of said memory corresponds to a common address of said first and second address signals, and said data selection and output means provides at said output thereof read data outputted from said memory array in response to said control signal indicating that memory cells selected corresponds to the data read mode of operation.

26. A semiconductor memory according to claim 25, wherein said memory array is at least a two-port controllably activated memory array in which a first port thereof through an input/output data bus and said first control means has a write/read capability and a second port thereof via an output data bus and said second control means has a read-only capability and operates independently of said first port, and wherein there is further included a data input and output buffer means, correspondingly associated with said first port, for selectively either transmitting from said input/output data bus, via said data input buffer means, data to-be-written into selected memory cells of said memory array or transmitting, via said output buffer means and said input/output data bus to said first control means, data read-out of selected memory cells of said memory array in accordance with address signals supplied by said first decode means.

27. A semiconductor memory according to claim 25, wherein said data selection and output means includes:
 a data selector circuit having at least one first input terminal coupled to an output of a data input buffer which is responsive to said predetermined data to-to-written, at least one second input terminal coupled to a read circuit of said memory array and having a control terminal for receiving said comparison signal outputted by said comparison means, and
 a data output buffer having an input coupled to an output of said data selector circuit and an output for providing said data to-be-written as read data to said second control means when the same memory cells in said memory array are selected as a result of a common address selection outputted by said first and second decode means at a common time period, and said data output buffer controllably providing read data outputted from said memory array to said second control means.

28. A semiconductor memory according to claim 27, wherein said first control means, said first decode means and said first address signals are correspondingly associated with a first port of a multi-port memory array, corresponding to said memory array, and said second control means, said second decode means and said second address signals are correspondingly associated with a second port of said multi-port memory array.

29. A semiconductor memory according to claim 28, wherein said comparison signal is indicative of whether or not there is agreement between said first and second address signals upon a concurrent selection of both said first and second ports into an operation mode.

30. A semiconductor memory according to claim 29, wherein said data output buffer of said data selection and output means is activated only when said second port is in an operation selection mode.

31. A semiconductor memory according to claim 30, wherein said data output buffer of said data selection and output means is selectively activated in response to a phase control signal upon said second port becoming activated by a second port enable signal and wherein said data selector circuit further includes means for selectively transmitting therethrough and, via said data output buffer, to said second control means one of: said data to-be-written in response to receiving said comparison signal indicative of said agreement, said read data outputted from said memory array when said comparison signal is not indicative of an agreement at the time of operation of said multi-port memory array when both of said first and second ports are in an operation selection mode, and said read data outputted from said memory array when only said second port is in an operation selection mode.

32. A semiconductor memory according to claim 31, wherein said first port has an input/output data bus for effecting a write/read mode capability and there is coupled to said input/output data bus an inverse parallel coupling arrangement of said data input buffer and a second data output buffer for selectively either transmitting from said input/output data bus, via said data input buffer, data to-be-written into selected memory cells of said memory array or transmitting to said input/output data bus, via said second data output buffer, and to said first control means data read-out of selected memory cells of said memory array in accordance with address signals supplied by said first decode means upon selection of said first port into an operation mode and during such time periods as when both said first and second ports are in an operation selection mode except when said comparison signal is indicative of an agreement between said first and second address signals wherein a read mode associated with said first port is effected when said comparison signal is indicative of an agreement, through said data selector circuit, via said first input terminal thereof, and said data output buffer of said data selection and output means to said second control means, thereby bypassing said memory array.

33. A semiconductor memory comprising: data input means for supplying write data to-be-written;
 mode selection means for effecting selection of said memory into one of a read operating mode, a write operating mode and into both a write and read operating modes;
 storage means for storing data therein, said storage means having a data input terminal, coupled to receive said write data from said data input means through data signal lines, and a data output terminal, wherein said storage means provides at said data output terminal thereof the data stored therein in response to a selection by said mode selection means of a data read mode operation and said storage means stores predetermined data applied to said data input terminal in response to said mode selection means effecting a data write mode operation; and
 data output means having an input coupled to receive said write data to-be-written from said data input means, having an output, and being responsive to a control signal, indicative of when said storage means is in both said data read mode and said data write mode of operation, for providing at the output of said data output means said write data to-be-written, wherein write data is supplied to said data output means directly from said data input means through a bypass means so that when said control signal is indicative of both said data write and read modes being effected concurrently, said write data is supplied as a read data through said data output means to said output thereof, bypassing said storage means and said data signal lines.

34. A semiconductor memory according to claim 33, wherein said storage means includes a flip-flop circuit constructed of a plurality of MOSFETs.

35. A semiconductor memory according to claim 34, wherein said plurality of MOSFETs include N-channel and P-channel MOSFETs.

36. A semiconductor memory according to claim 33, wherein said data output means includes at least one clocked inverter each one thereof having a control terminal coupled to receive a control signal indicating that said storage means is in both the data read mode and the data write mode of operation thereof.

37. A semiconductor memory according to claim 33, wherein said data output means has a first input coupled to receive said write data to-be-written, in said storage means, a second input coupled to said data output terminal of said storage means, a control terminal coupled to receive said control signal and an output, and wherein said data output means is controlled by said control signal so that said data output means provides at said output thereof said write data to-be-written in response to said control signal indicating that said storage means is concurrently in both the data read mode and the data write mode of operation, said data output means provides at said output thereof the data stored in said storage means in response to the control signal indicating that said storage means is in the data read mode.

* * * * *